United States Patent [19]

Heilman et al.

[11] Patent Number: 5,086,242
[45] Date of Patent: Feb. 4, 1992

[54] FAST TURN-OFF OF THYRISTOR STRUCTURE

[75] Inventors: Randy T. Heilman, Palm City; John S. Prentice, Palm Bay, both of Fla.

[73] Assignee: Harris Corporation, Melbourne, Fla.

[21] Appl. No.: 598,165

[22] Filed: Oct. 16, 1990

[51] Int. Cl.⁵ .................... H03K 17/72; H01L 29/74
[52] U.S. Cl. .................... 307/631; 307/633; 307/637; 357/38
[58] Field of Search ............. 307/630, 631, 633, 634, 307/305; 357/20, 38

[56] References Cited

U.S. PATENT DOCUMENTS

| | | | |
|---|---|---|---|
| 4,071,779 | 1/1978 | Kawanami | 307/637 |
| 4,315,168 | 2/1982 | Ohhinata | 307/637 |
| 4,365,170 | 12/1982 | Okuhara | 307/631 |
| 4,635,087 | 1/1987 | Birrittella et al. | |
| 4,677,455 | 6/1987 | Okajima | |
| 4,743,950 | 5/1988 | Roggwiller | 307/305 |
| 4,786,958 | 11/1988 | Bhagat | 357/38 |
| 4,833,587 | 5/1989 | Sugayama et al. | 307/637 |

*Primary Examiner*—John Zazworsky
*Attorney, Agent, or Firm*—Barnes & Thornburg

[57] ABSTRACT

A fast turn-off thyristor including a first active shunt region in the cathode gate region connected electrically to the anode terminal for shunting carriers around the anode gate region in response to the thyristor being on and a second shunt region in the anode gate region connected electrically to the cathode terminal for shunting carriers around the cathode gate region in response to the thyristor being on. These active shunts are inactive until the thyristor is turned on and are structured to remain active until after the thyristor is turned off. The active shunts are transistors in parallel with the pair of interconnected transistors which are for a PNPN thyristor.

16 Claims, 5 Drawing Sheets

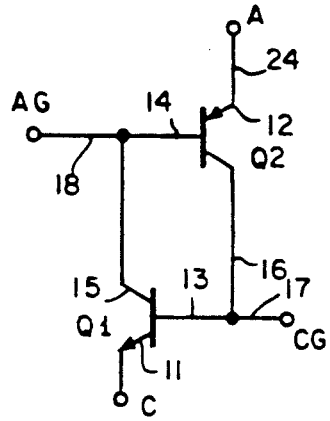
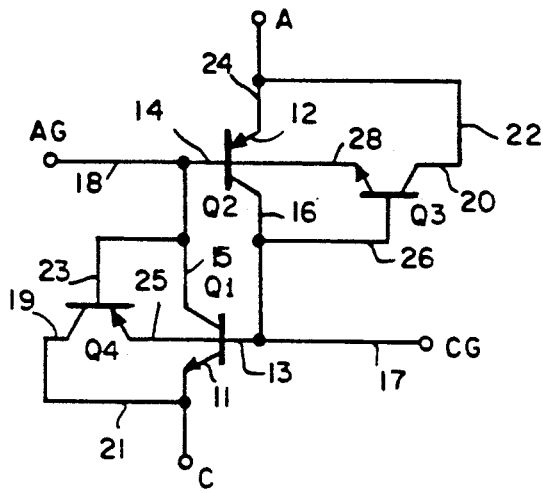
PRIOR ART
FIG. 1
FIG. 2
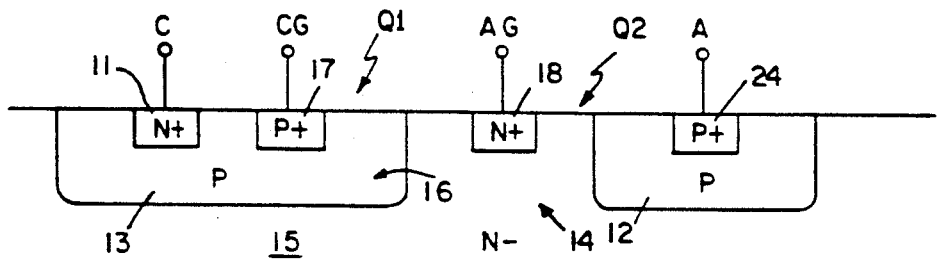
PRIOR ART
FIG. 3
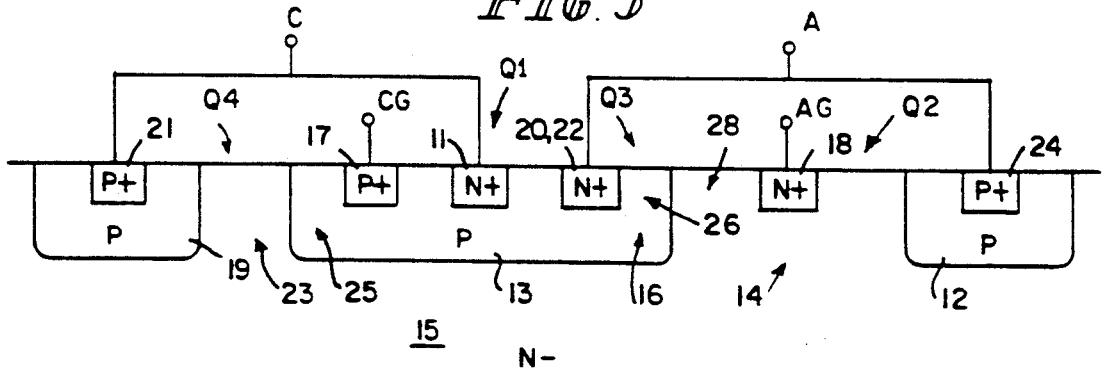
FIG. 4

FAST TURN-OFF OF THYRISTOR STRUCTURE

BACKGROUND AND SUMMARY OF THE INVENTION

The present invention relates generally to PNPN thyristor structures and more specifically to a PNPN thyristor structure with improved recovery time. These devices may be silicon controlled rectifiers (SCR) or gate turn-off SCRs (GTO-SCR). A GTO-SCR is a PNPN thyristor designed to be turned-off, usually by removing current from the cathode gate.

The turn-off sequence of the GTO-SCR is often described by three periods of time; storage time, fall time and tail time. Storage time is the period from the beginning of turn-off until the anode current begins to drop. This assumes turn-off is GTO action using cathode gate. This time is dependent upon the amount of charge stored in the SCR and how fast it can be removed. The fall time is the period during which the anode current drops from 90% to 10% of its initial value. It begins when enough stored charge is removed to allow the middle junction to become reverse biased. Once the junction is reverse biased, the SCR impedance increases which results in the fall of the anode current. The tail current time is the period during which the remaining stored charge is removed. Often this time is extended because BJT action replaces stored charge almost as fast as it is removed, dependent of the BJT current gain.

The turn-off time can be decreased by limiting the amount of charged stored during "on" operation. The two most common techniques are lifetime reduction and anode and/or cathode shorts. The lifetime can be reduced by doping with metal such as gold or by making defects with irradiation by high energy particles. These allow electrons and holes to more readily recombine reducing the number of free carriers at any given time. Anode or cathode shorts also reduce the number of free carriers for a given terminal current by decreasing the injection efficiency of the anode or cathode. With an anode short for example, there would be a region in the anode gate diffusion that is ohmically or electrically connected to the anode terminal. This is the "short" or "shunt". Some of the electrons injected by the N+ cathode go through this shunt region directly to the anode contact instead of crossing the anode/anode gate junction. This reduced the forward bias on the anode/anode gate junction which in turn reduces the holes injected by the P+ anode.

Both of these techniques have some disadvantages. They are more effective at lower current densities than higher. The concentration density of active metal or defects is limited by material and processing considerations. At carrier concentrations above 1E17, Auger recombination is dominant so the peak concentrations at high current densities are the same as if there was no lifetime reduction. However, lifetime reduction will increase the turn-on gate drive requirements and increase the "off" state leakage current.

Likewise the anode/cathode shorts become less effective at higher current densities since the junction voltages increase logarithmically with the junction current. The current through the resistive shunt is proportional to the voltage across the junction. Therefore the ratio of shunt current to junction current falls as the total anode terminal current increases. This makes the device difficult to turn on since the gate drive has to supply the shunt current. At some high current, the percentage of shunt current is too small to make a difference.

Thus it is an object of the present invention to provide a thyristor structure having fast turn-off effective at high current densities.

Another object of the present invention is to provide a fast turn-off thyristor structure without increasing the turn-on gate drive requirements.

These and other objects are achieved by providing a first active shunt region in the cathode gate region connected electrically to the anode terminal for shunting carriers around the anode gate region in response to the thyristor switch being on and a second active shunt region in the anode gate region connected electrically to the cathode terminal for shunting carriers around the cathode gate region in response to the thyristor being on. These active shunts are off when the main thyristor is off so that they do not increase the turn-on gate current and do not degrade the off state leakage.

The active shunts pass more current as free carrier concentration increases. This tends to limit the peak carrier concentration. For any given anode/cathode terminal current, the free carrier concentration is reduced below the level that would be present if the active shunts were absent. This reduces the total stored charge which decreases the turn-off time. Unlike previous devices using resistive shunts or lifetime reduction, the improved thyristor becomes faster as the terminal currents increase. The ratio of active shunt area to anode or cathode area could be adjusted to control the peak concentration value or even cause the thyristor to be self-current limiting.

The shunts are active regions which are inactive until the thyristor is turned on and remain active until after the thyristor is turned off. The anode gate contact region is closer to the active anode gate portion of the anode gate region than an active shunt portion of the anode gate region. Similarly, the cathode gate contact is closer to the active cathode gate portion of the cathode gate region than to the active shunt portion of the cathode gate region. Using a two transistor model for the thyristor, a first PNP transistor has its base and collector connected respectively to the collector and base of a first NPN transistor. The first PNP's emitter is the anode, the first PNP's base is the anode gate, the first NPN's base is the cathode gate and the first NPN's emitter is the cathode. The first shunt is a second NPN having its collector, base and emitter connected respectively to the emitter, collector and base of the first PNP transistor. The second shunt is a second PNP transistor having its collector, base and emitter connected respectively to the emitter, collector and base of the first NPN transistor.

In one preferred embodiment, the first NPN and PNP transistors are vertical transistors and the second NPN and PNP transistors are lateral transistors. In this embodiment, the base of the first NPN is a common region with the emitter of the second PNP. The collector of the first NPN is a common region with the base of the second PNP. The base of the first PNP is a common region with the emitter of the second NPN. Finally, the collector of the first PNP is a common region with the base of the second NPN. The first PNP's collector region has a boundary with the first NPN's base region and the first NPN's collector region has a boundary with the first PNP's base region. Also, the base of the first NPN is a first common region with the base of the second NPN and the base of the first PNP is a second common region with the base of the PNP. Using this four transistor analogy, the anode gate's contact region is closer to the first PNP's active base portion of the second common region than to the second PNP's active base portion of the second common region. Also, the cathode gate contact region is closer to the first NPN's active base portion of the first common region than to the second NPN active base portion of the first common region.

Other objects, advantages and novel features of the present invention will become apparent from the following detailed description of the invention when considered in conjunction with the accompanying drawings.

BRIEF DESCRIPTION OF THE DRAWINGS

FIG. 1 is a schematic of a prior art thyristor;

FIG. 2 is a schematic of an improved thyristor incorporating the principles of the present invention;

FIG. 3 is a cross section of a thyristor of the prior art;

FIG. 4 is a cross-section of a first embodiment of a thyristor incorporating the principles of the present invention;

DETAILED DESCRIPTION OF THE DRAWINGS

Figure 6:
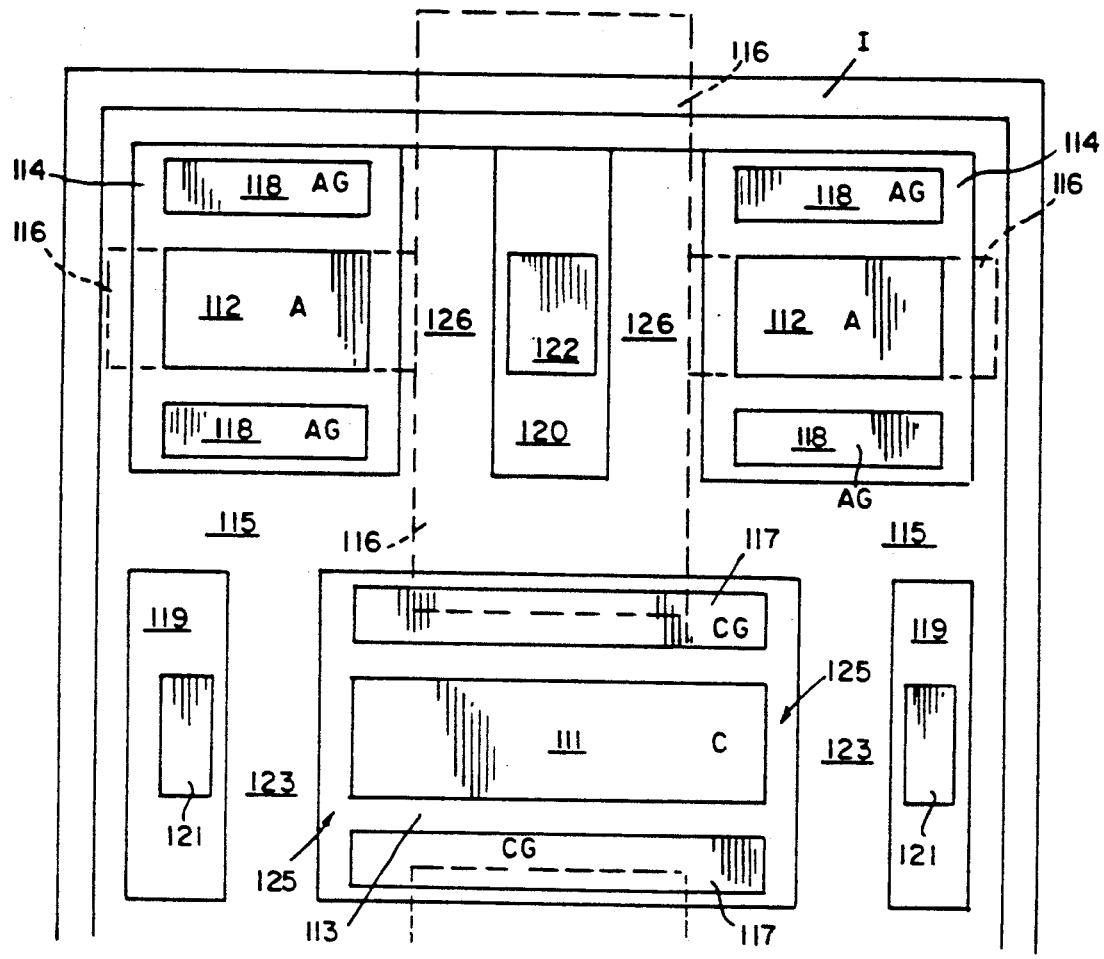
FIG. 6 is a plan view of the thyristor structure of FIG. 5.

A PNPN thyristor is generally modeled as an appropriately connected pair of NPN and PNP transistors as illustrated in FIG. 1. Transistor Q1 includes an emitter 11, base 13 and collector 15. Transistor Q2 includes an emitter 12, a base 14 and a collector 16. The collector 15 of Q1 is connected to the base 14 of Q2. Collector 16 of Q2 is connected to the base 13 of Q1. A contact 24 and the emitter 12 forms the anode, the base 14 with contact 18 of Q2 forms the anode gate, the base 13 with contact 17 of Q1 forms a cathode gate and the emitter 11 of Q1 forms the cathode.

As illustrated in FIG. 3, the side portion 16 of P region 13 adjacent P anode region 12 forms the active collector region of Q2. Q1 is a vertical NPN transistor with the N+ emitter 11 formed in the P base 13 which is formed in the N− collector 15. Transistor Q2 is a lateral PNP wherein portion 16 of P region 13 forms the collector, region 14 of N− region 15 forms the base and P region 12 forms the emitter P+ region 17 in region 13 forms the contact region for the cathode gate and P+ region 24 in region 12 forms the contact region for the anode contact. N+ region 18 in 15 forms the contact area for the anode gate. It should be noted that the N+ contact region 18 for the anode gate may be in region 14 as illustrated, or at any portion of the substrate 15.

As discussed previously, resistor anode shunts would be an N+ region in the N− anode gate region 15 and electrically connected externally to anode terminal A. Similarly, a resistive cathode shunt would be a P+ region in P cathode gate region 13 and electrically connected to the cathode terminal C.

The present design, as illustrated in FIG. 2, provides active shunts instead of resistive shunts to shunt carriers around the cathode gate to the cathode terminal and around the anode gate to the anode terminal These shunts are illustrated as transistors Q3 and Q4. Those portions of the transistors and semiconductor regions which have common function as those of FIGS. 1 and 3 have the same number in FIGS. 2 and 4. Transistor Q3 includes a collector 20, 22 connected electrically to the emitter 12 of Q2 which includes a contact area 24 at the anode terminal A. The base 26 of transistor Q3 is connected to the collector 16 of Q2 and the base 13 of Q1. The emitter 28 of Q3 is connected to the base 14 of Q2 and the collector 15 of Q1. Similarly, the collector 19 of Q4 is connected electrically via contact area 21 to the emitter 11 of Q1 at the cathode terminal. The base 23 of Q4 is connected to the collector 15 of Q1 and the base 14 of Q2. The emitter 25 of Q4 is connected to the base 13 of Q1 and the collector 16 of Q2.

Comparing FIGS. 3 and 4, an N+ shunt region 20, 22 is Positioned in the lateral edge or active collector portion 16 of transistor Q2 so as to form a lateral NPN transistor Q3 having an N+ collector 20, 22, a P base region 26 which forms a portion of the edge 16 of the P region 13 and an emitter region 28 of base region 14 of Q2 with a base contact N+ 18 which is the anode gate contact. A P shunt region 19 with contact region 21 is formed in the N− collector region 15 adjacent an edge 25 of the P base region 13 of transistor Q1. Transistor Q4 is a lateral transistor including the collector region 19 and collector contact 21, a base portion 23 of the N− collector region 15 of Q1 and a P type emitter region 25 which is the lateral edge of the P− base region 13 of Q1. Cathode gate P+ region 17 is connected adjacent the edge 25. External electrical connection of the cathode is to the emitter region 11 of Q1 and the collector contact region 21 of Q4. Similarly, the anode is externally electrically connected to the emitter contact region contact 24 of Q2 and the collector region 20, 22 of Q3.

The operation of the device of FIGS. 2 and 4 begin with considering the thyristor to be in the off state. Transistors Q1 and Q2 are off since there is no source of base current. Transistors Q3 and Q4 are off because their emitter base junctions as well as their collector base junctions are reversed biased. Turn-on of the thyristor is accomplished by injecting current into the cathode gate or base 13 of Q1 or it may also be turned on by drawing current out of the anode gate or the base 14 of Q2. Transistor Q1 supplies the base drive for Q2 and vice versa and therefore activation of either the anode gate or the cathode gate will turn on both transistors Q1 and Q2.

Transistors Q3 and Q4 remain off until the base-collector junction 13/15 and 14/16 of Q1 and Q2 are forward biased or go into saturation. Some of the holes injected by the anode or the emitter 12 of Q2 pass through Q4 to the cathode terminal connected via collector 19 via N− region 15 as well as removing holes from region 25 of P region 13 instead of flowing to the cathode terminal via emitter 11 and base 13 of Q1. This reduces the base current of Q1 which reduces the rate of electrons injected by the cathode or emitter region 11 of Q1. Similarly, some of the electrons injected by cathode or the emitter 11 of Q1 pass through Q3 to its N+ collector 20, 22 to the anode terminal through P base region 13 instead of passing through Q1 in base region 13 to the collector 15. Similarly, electrons are drawn from base 28 of Q3 in base 14 of Q2. This reduces the base current of the base drive of Q2 which reduces the rate of hole injection of the anode or emitter 12 of Q2.

In this way, the hole and electron concentration in the N region base 14 of Q2 and collector 15 of Q1 and the P region base 13, 16 of Q1 and collector of Q2 are below the levels obtained in the absence of the active shunts Q3 and Q4. The active shunts Q3 and Q4 act to clamp the stored charge to a level well below the level obtained without these active shunts.

The N and P base and collector regions 13, 16, 15, 14 of Q1 and Q2 extend over a sufficiently large distance that the carrier concentration may not be uniform. This is particularly true during turn-off A depletion may form at the metallurgical junction between the collector-base regions, before all excess carrier densities near the active base-emitter junctions 11/13 and 12/14 of Q1 and Q2 respectively are redistributed. To permit redistribution of the excess charge, Q3 and Q4 are configured to remain on after Q1 and Q2 are turned off until the excess charge near the cathode and anode is removed. This is achieved by placing the N+ anode gate contact region 18 in the anode gate 15, 14, 23 closer to the active base region 14 of Q2 than the active shunt region or base region 23 of Q4. Thus the excess charge, namely holes, are collected by the anode gate 18, turning transistor Q2 off first with a depletion region ultimately extending and removing charge from base region 23 of Q4. Additionally, depletion in base region 23 is delayed by resulting electrostatic shielding as compared to the remainder of region 15. Thus Q4 remains on due to the excess charge built up in base 23 longer than Q2. Similarly, the P+ cathode gate contact region 17 in the cathode gate 13 is closer to the active gate region of 13 between N+ emitter 11 and N− collector 15 than it is to the active gate region 26 of transistor Q3. Thus the excess of charge or holes collected by P+ region 17 depletes the region or the base of Q1 before the base of Q3 turning Q1 off first.

Figure 5:
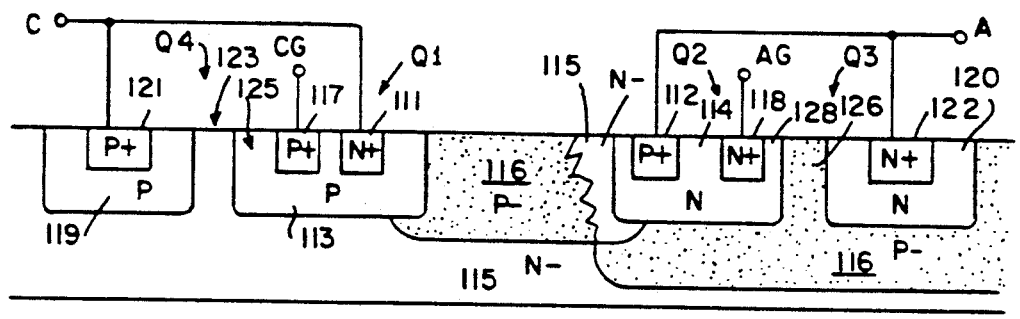
FIG. 5 is a cross-section of a second embodiment of a thyristor incorporating the principles of the present invention.

FIGS. 5 and 6 illustrate a preferred embodiment of schematic FIG. 2 wherein transistors Q1 and Q2 are vertical transistors and transistors Q3 and Q4 are lateral transistors. Those portions having a similar operation as that in FIG. 4 have the same tens and unit number. Transistor Q1 has an emitter 111 in a base 113 in a collector 115. Transistor Q2 has an emitter 112 in a base 114 in a collector 116. Transistor Q3 includes an emitter 114, 128, a base 126 and a collector 120 having collector contact 122. Q4 includes an emitter 113, 125, a base 123 and a collector 119 with collector contact 121. The N− collector region 115 of Q1 is connected to the N base region 114 of Q2 and that the P− collector region 116 of Q2 is connected to the base region 113 of Q1.

The operation of FIGS. 5 and 6 is identical to that of FIG. 4 wherein the excess charges in the low impurity concentration regions 115 and 116 are removed first from the Portion that forms the collector region 115, 116 of transistors Q1 and Q2 and lastly from the base regions 123, 126 of transistors Q4 and Q3 respectively. Thus the depletion region turns Q1 and Q2 off first and subsequently Q3 and Q4. This allows excess charge near the anode and cathode to be removed. The anode gate contact region 118 is closer to the active gate region 114 of transistor Q2 than it is to the active gate region 123 of Q4. Similarly, the cathode gate contact region 117 is closer to the active gate region 113 of Q1 than it is to the active gate region 126 of Q3.

It should be noted that in FIG. 5 the base 113 of Q1 and the collector 116 of Q2 have the same P conductivity type and are interconnected through the substrate as distinguishable from 13 and 16 of FIG. 4 where they are a common diffused region. Thus they are considered common with respect to the integrated circuit even though they have different impurity concentrations. Similarly, the N− collector 115 of Q1 and the N base region 114 of Q2 are interconnected and have the same conductivity type and may be considered common with respect to the integrated circuit, they have different impurity concentrations.

Figure 7:
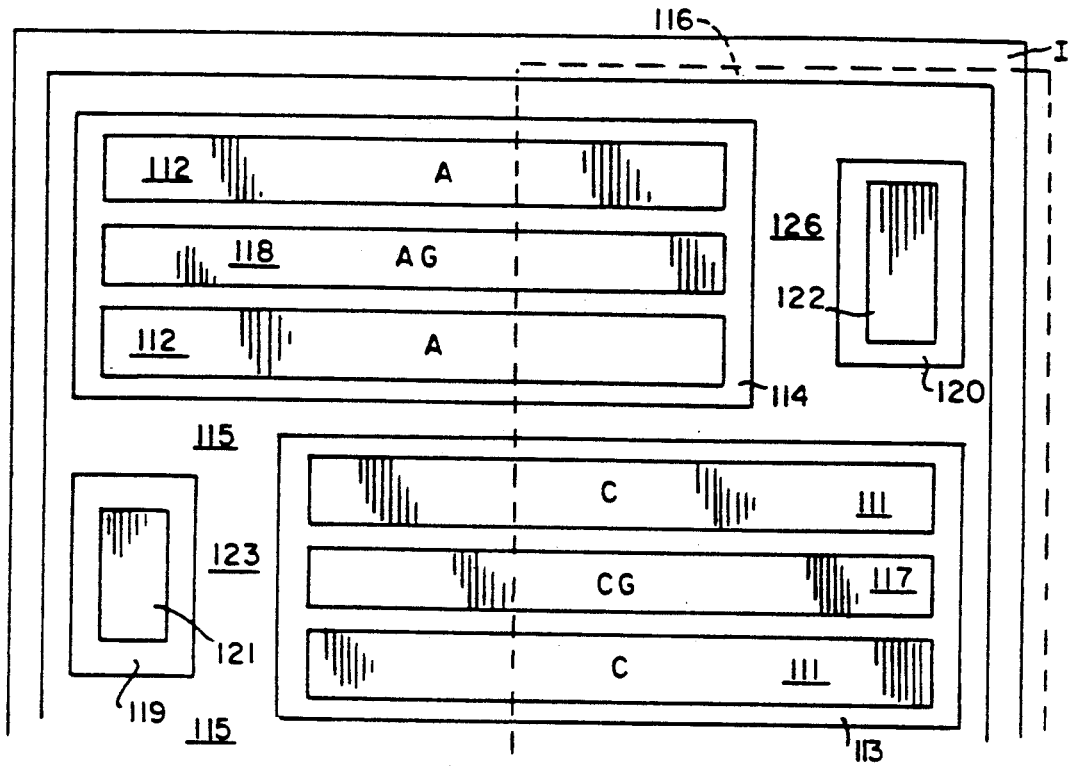
FIG. 7 is a plan view of a third embodiment of a thyristor incorporating the principles of the present invention.

FIG. 7 is an alternative or simplified version of the configuration of FIGS. 5 and 6 with the same functional regions having the same reference numbers. As is more evident from FIG. 7, the base and emitter regions of Q1 extend into the collector region 116 of Q2 and the base and emitter regions of Q2 extend into the collector 115 of Q2. This provides fast turn-on as described in co-pending application Ser. No. 07/451,249 filed Dec. 15, 1989, now U.S. Pat. No. 4,979,011, to John Prentice and commonly assigned. A device built only for first hand turn-on is illustrated in FIG. 8 and was used for comparison with the device of FIG. 6.

Figure 8:
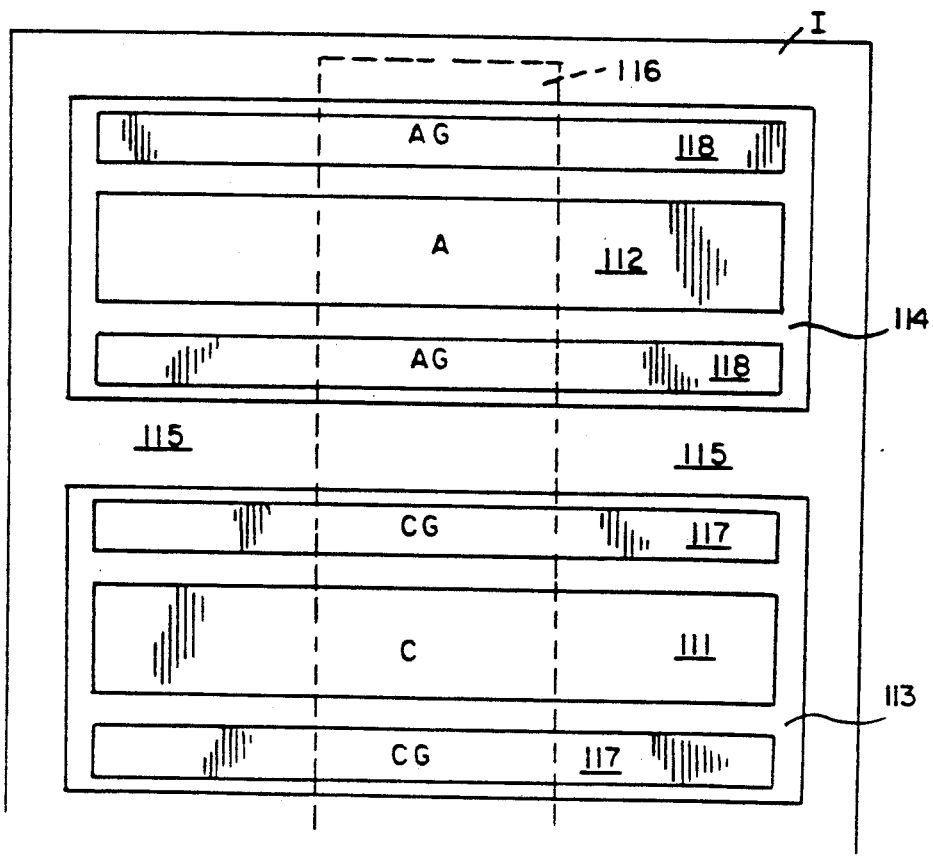
FIG. 8 is a plan view of a thyristor used for comparative results against the thyristor of FIG. 6.

The devices of FIGS. 6 and 8 were compared driving a capacitive load. A 20 nano farrad capacitor was charged to 20 volts and then discharged by the thyristor structures. The cathode gate voltage was monitored to determine the state of the thyristor internal charge since the cathode gate/cathode juncture remains forward biased until all the storage charge has dissipated. A third device, namely the configuration of FIG. 8 exposed to electron radiation, was also compared. The thyristor of FIG. 8 without electron irradiation turned off in about 4 microseconds, while the same geometry exposed to electron irradiation turned off in about 2.5 microseconds. The thyristor of FIG. 6 turned off in only 1.5 microseconds.

Figure 9:
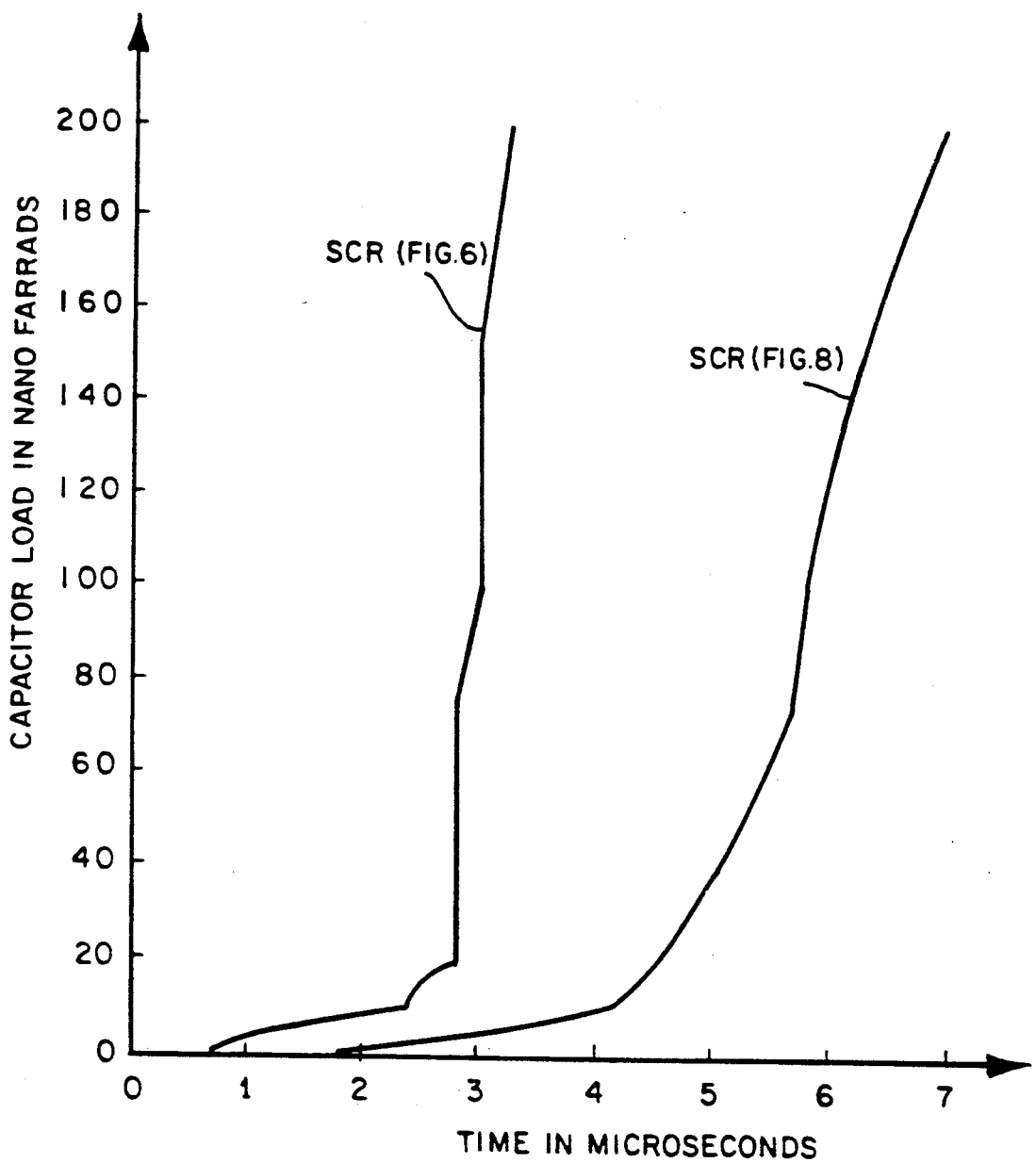
FIG. 9 is a graph comparing the thyristors of FIGS. 6 and 8 for capacitive load versus cathode gate turn-off time.
Figure 10:
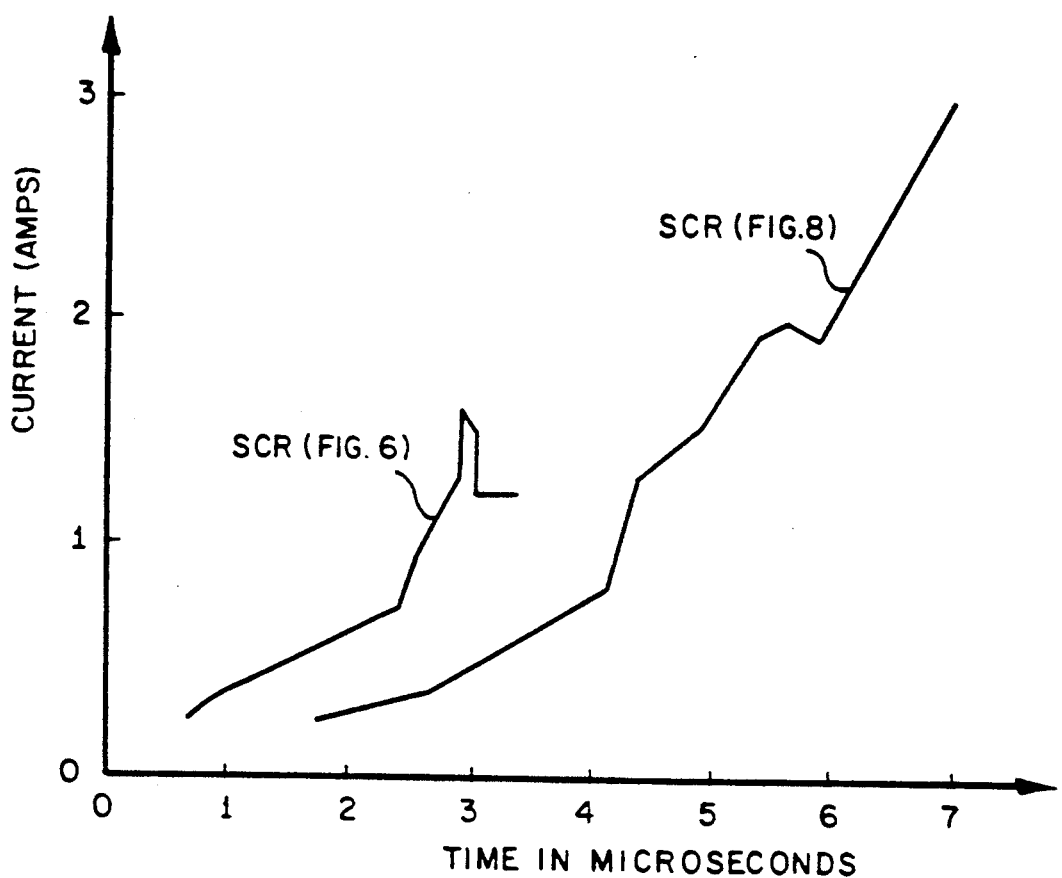
FIG. 10 is a graph comparing the thyristors of FIG. 6 and FIG. 8 for output current versus cathode gate turn-off time.

The graphs of FIGS. 9 and 10 show the results of comparison between the thyristor of FIG. 6 and the thyristor of FIG. 8 without irradiation for other load conditions. As will be noted, the thyristor of the invention of FIG. 6 decreases turn-off by more than 50%. FIG. 9 shows the thyristor of the present invention turn-off time is clamped at around 3 microseconds for a 20 nano farrad to a 200 nano farrad load. This results because the peak current limits at about 1.3 amps. This is useful in switching devices to reduce variations in switching speed as a function of load. Using a capacitive load ranging from 1 nano farrad to 200 nano farrad, FIG. 10 shows the current limiting effect of the thyristor of the present invention. The reduced current limits the charged storage and the cathode gate turn-off time. For equal anode currents, the turn-off time of the new thyristor is half the thyristor turn-off time of FIG. 9.

Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed:

1. A latching switch, having an anode, anode gate, cathode gate and cathode, comprising:
    a first PNP transistor having its collector and base connected respectively to a base and a collector of a first NPN transistor;
    a second PNP transistor having its collector, base and emitter connected respectively to an emitter, collector and base of said first NPN transistor;
    a second NPN transistor having its collector, base and emitter connected respectively to an emitter, collector and base of said first PNP transistor; and
    said first PNP's emitter being said anode, said first PNP's base being said anode gate, said first NPN's base being said cathode gate and said first NPN's emitter being said cathode.

2. A latching switch according to claim 1, wherein said first NPN and PNP are vertical transistors and said second NPN and PNP are lateral transistors.

3. A latching switch according to claim 2, wherein:
    said base of said first NPN is a common region with the emitter of said second PNP;
    said collector of said first NPN is a common region with the base of said second PNP; said base of said first PNP is a common region with the emitter of said second NPN; and
    said collector of said first PNP is a common region with the base of said second NPN.

4. A latching switch according to claim 3, wherein:
    said first PNP's collector region has a boundary with said first NPN's base region; and
    said first NPN's collector region has a boundary with said first PNP's base region.

5. A latching switch according to claim 1, wherein:
    said base of said first NPN is a common region with the emitter of said second PNP;
    said collector of said first NPN is a common region with the base of said second PNP;
    said base of said first PNP is a common region with the emitter of said second NPN; and
    said collector of said first PNP is a common region with the base of said second NPN.

6. A latching switch according to claim 5, wherein:
    said first PNP's collector region has a boundary with said first NPN's base region; and
    said first NPN's collector region has a boundary with said first PNP's base region.

7. A latching switch according to claim 1, wherein:
    said base of said first NPN is a first common region with the base of said second NPN;
    said base of said first PNP is a second common region with the base of said second PNP;
    a cathode gate's contact region is closer to said first NPN's active base portion of said first common region than to said second NPN's active base portion of said first common region; and
    an anode gate's contact region is closer to said first PNP's active base portion of said second common region than said second PNP's active base portion of said second common region.

8. A latching switch, having an anode, anode gate, cathode gate and cathode, comprising:
    a first PNP transistor having its collector and base connected respectively to a base and a collector of a first NPN transistor;
    said first PNP's emitter being said anode, said first PNP's base being said anode gate, said first NPN's base being said cathode gate and said first NPN's emitter being said cathode;
    a first shunt means connected between an anode terminal and said anode gate for shunting carriers around said first PNP transistor in response to said first PNP transistor being on; and
    a second shunt means connected between a cathode terminal and said cathode gate for shunting carriers around said first NPN transistor in response to said first NPN transistor being on.

9. A latching switch according to claim 8, wherein:
    said first shunt means includes a conduction path connected between said anode terminal and said anode gate and a control terminal connected to said collector of said first PNP; and
    said second shunt means includes a conduction path connected between said cathode terminal and said cathode gate and a control terminal connected to said collector of said first NPN.

10. A latching switch according to claim 9, wherein:
    said first shunt means includes a second NPN transistor; and
    said second shunt means includes a second PNP transistor.

11. A latching switch according to claim 10, wherein said first NPN and PNP are vertical transistors and said second NPN and PNP are lateral transistors.

12. A latching switch according to claim 8, wherein said first and second shunt means are inactive until said first PNP and NPN transistors turn on.

13. A latching switch according to claim 8, wherein said first and second shunt means remain active until after said first PNP and NPN transistors turn off.

14. A latching switch having an anode region, anode gate region, cathode gate region and cathode region integrated into a substrate with anode and cathode terminals; said anode gate region separating said anode region from said cathode gate region and said cathode gate region separating said cathode region from said anode gate region; said switch comprising:
    an N-type shunt region in said cathode gate region and connected electrically to said anode terminal for shunting carriers around said anode gate region in response to said switch being on; and
    a P-type shunt region in said anode gate region and connected electrically to said cathode terminal for shunting carriers around said cathode gate region in response to said switch being on.

15. A latching switch according to claim 14, wherein said cathode gate region separates said N-type shunt region from said anode gate region and said anode gate region separates said P-type shunt region from said cathode gate region.

16. A latching switch according to claim 14, wherein:
    an anode gate's contact region is closer to an active anode gate portion of said anode gate region than to an active shunt portion of said anode gate region ; and
    a cathode gate's contact region is closer to an active cathode gate portion of said cathode gate region than to an active shunt portion of said cathode gate region.

* * * * *